(12) United States Patent
Chi et al.

(10) Patent No.: US 12,282,611 B2
(45) Date of Patent: Apr. 22, 2025

(54) INFORMATION HANDLING SYSTEM HYBRID HEAT BLOCK KEYBOARD

(71) Applicant: Dell Products L.P., Round Rock, TX (US)

(72) Inventors: Po Hung Chi, New Taipei (TW); Ling Yi Chu, New Taipei (TW)

( * ) Notice: Subject to any disclaimer, the term of this patent is extended or adjusted under 35 U.S.C. 154(b) by 0 days.

(21) Appl. No.: 18/233,948

(22) Filed: Aug. 15, 2023

(65) Prior Publication Data

US 2025/0060833 A1 Feb. 20, 2025

(51) Int. Cl.
| | |
|---|---|
| G06F 1/20 | (2006.01) |
| G06F 1/16 | (2006.01) |
| G06F 3/02 | (2006.01) |
| H05K 1/02 | (2006.01) |
| H05K 7/20 | (2006.01) |
| G11C 7/04 | (2006.01) |

(52) U.S. Cl.
CPC .......... *G06F 3/0202* (2013.01); *G06F 1/1662* (2013.01); *G06F 1/203* (2013.01); *G06F 1/206* (2013.01); *H05K 1/0201* (2013.01); *H05K 7/205* (2013.01); *H05K 7/20954* (2013.01); *G11C 7/04* (2013.01); *H05K 7/20518* (2013.01)

(58) Field of Classification Search
CPC ...... G06F 1/203; G06F 1/1616; G06F 1/1613; G06F 1/206; G06F 2119/08; G06F 1/20; G06F 3/0202; G06F 1/1662; G06F 1/1601; G06F 3/0227; G06F 3/02; G06F 1/3215; H05K 1/0203; H05K 1/0201; H05K 1/0209; H05K 1/0212; H05K 2201/066; H05K 7/20154; H05K 7/207; G11C 7/04
See application file for complete search history.

(56) References Cited

U.S. PATENT DOCUMENTS

| | | | |
|---|---|---|---|
| 5,729,431 A * | 3/1998 | Marwah | G06F 1/203 257/713 |
| 8,050,028 B2 | 11/2011 | Merz et al. | |
| 10,579,112 B2 | 3/2020 | North et al. | |
| 10,635,145 B2 * | 4/2020 | Sultenfuss | G06F 1/20 |
| 11,079,816 B1 * | 8/2021 | North | H10N 30/03 |
| 11,744,045 B2 * | 8/2023 | Lin | G06F 1/203 361/679.54 |
| 2006/0198108 A1 * | 9/2006 | Refai-Ahmed | H05K 1/0203 361/719 |
| 2009/0213550 A1 * | 8/2009 | Hongo | H05K 7/20509 361/704 |
| 2010/0053899 A1 * | 3/2010 | Hashimoto | H01L 23/427 165/185 |

(Continued)

*Primary Examiner* — Dismery Mercedes
(74) *Attorney, Agent, or Firm* — Zagorin Cave LLP; Robert W. Holland (57) ABSTRACT

A portable information handling system manages thermal energy presented at a keyboard with a hybrid support plate having a first portion of a first material and first thermal conductivity and a second material of a second thermal conductivity so that heat is presented in an even manner at the keyboard. For example, a keyboard support plate of a metal, such as steel, has a portion of liquid crystal polymer aligned with a central processing unit to impede heat transfer at the location of the central processing unit. In various embodiments, the liquid crystal polymer can include a carbon liquid crystal polymer and a delta liquid crystal polymer.

14 Claims, 5 Drawing Sheets

(56) References Cited

U.S. PATENT DOCUMENTS

| | | | |
|---|---|---|---|
| 2012/0127662 A1* | 5/2012 | Sun | G06F 1/1662 |
| | | | 361/679.01 |
| 2014/0168874 A1* | 6/2014 | MacDonald | G06F 1/203 |
| | | | 361/720 |
| 2014/0340208 A1* | 11/2014 | Tan | H01H 57/00 |
| | | | 340/407.2 |
| 2015/0332874 A1* | 11/2015 | Brock | H01H 11/00 |
| | | | 29/622 |
| 2016/0358725 A1* | 12/2016 | Liao | H01H 13/85 |
| 2017/0055374 A1* | 2/2017 | Penttinen | H05K 3/303 |
| 2018/0210508 A1* | 7/2018 | Aurongzeb | G06F 1/1652 |
| 2019/0101960 A1* | 4/2019 | Silvanto | H04M 1/0249 |
| 2022/0113759 A1 | 4/2022 | Raju et al. | |
| 2022/0312627 A1* | 9/2022 | Yoshihara | G11C 5/04 |

* cited by examiner

INFORMATION HANDLING SYSTEM HYBRID HEAT BLOCK KEYBOARD

BACKGROUND OF THE INVENTION

Field of the Invention

The present invention relates in general to the field of portable information handling systems, and more particularly to an information handling system hybrid heat block keyboard.

Description Of The Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Over time, portable information handling systems have trended towards minimal footprint designs that reduced system weight. Since the length and width of a portable information handling system is typically driven by an end user selection of integrated display dimensions, reduced weight is typically achieved by reduced system thickness. A reduced main housing thickness is typically achieved by reducing processing component power consumption, which allows for a smaller battery and less thermal rejection. In many instances, thermal constraints are managed with passive thermal rejection that seeks to pass excess thermal energy through the housing without an active thermal rejection system, such as a cooling fan. To achieve housing skin temperatures that are acceptable for end user touch during mobile system use, thermal energy within the housing is typically directed to areas that an end user will not touch, such as heat sink and heat exchanger at a rear side of the housing. At other parts of the housing that an end user may touch, an even distribution of thermal energy is generally sought so that the end user does not have any "hotspots" that will have greater temperatures than surrounding areas of the housing. These hotspots can cause end user discomfort and may also result in throttling of the system processor or other components to reduce power dissipation that generates heat even though the housing as a whole is within temperature constraints.

In particular, the housing area around the processor tends to have greater amounts of thermal energy due to processor power dissipation. Thermal energy is typically routed away from the processor with a heat pipe or other conductive material and towards a heat exchanger at the rear of the housing. One difficulty with thermal spreading related to the processor is that low profile information handling systems with thin housings can tend to dissipate thermal energy upward and through the system keyboard. The keyboard typically has a layer of keys over a sheet of metal that supports a membrane having key input sensors. When a key is pressed against the membrane, the underlying support of the sheet metal ensures that the membrane detects the key press. In a low profile portable information handling system, the sheet metal tends to receive thermal energy from the processor, which can translate to a hotspot in the portion of the keyboard located above the processor.

SUMMARY OF THE INVENTION

Therefore, a need has arisen for a system and method which manages transfer of thermal energy from an information handling system housing interior through a keyboard to the housing exterior.

In accordance with the present invention, a system and method are provided which substantially reduce the disadvantages and problems associated with previous methods and systems for thermal rejection from an information handling system housing interior to the exterior. A keyboard integrated in the housing has plural keys disposed over a membrane and a support plate. The support has first and second portions with first and second materials having first and second thermal conductivities so that thermal energy rejected through the housing at the keyboard is managed to avoid hotspots.

More specifically, a portable information handling system is built in a housing having a main housing portion that contains processing components and a lid housing portion that integrates a display. The processing components include a processor that executes instructions to process information, a memory that stores the instructions and information, and a graphics processor that processes information to generate visual images for presentation at a display. A cover housing portion couples over the main housing portion and has a keyboard and touchpad exposed at an upper surface to accept end user inputs. The keyboard has plural keys coupled over a membrane with sensors to detect key inputs and a support plate to support the membrane against key presses. The support plate as a first material portion, such as steel, with a first thermal conductivity and a second material portion, such as plastic, with a second thermal conductivity. The first and second portions couple to form a contiguous support plate with first and second thermal conductive areas that reject thermal energy from the housing interior through the keyboard at different rates so that hot spots are avoided at the housing exterior.

The present invention provides a number of important technical advantages. One example of an important technical advantage is that an information handling system housing avoids hot spots associated with rejection of internal thermal energy with a keyboard support plate having portions with different thermal conductivity. A liquid crystal polymer (LCP) used in a low thermal conductivity portion reduces thermal rejection at hot spots, such as at a CPU or GPU location. The integration of portions of different thermal conductivity into a contiguous support plate help to simplify assembly of the information with a reduced need for heat spreading solutions, such as graphite or gore sheets. The use of LCP helps to minimize cost and avoids increases in the system height.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A portable information handling system keyboard support plate has a portion of a material of a reduced thermal conductivity to manage housing external temperature. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
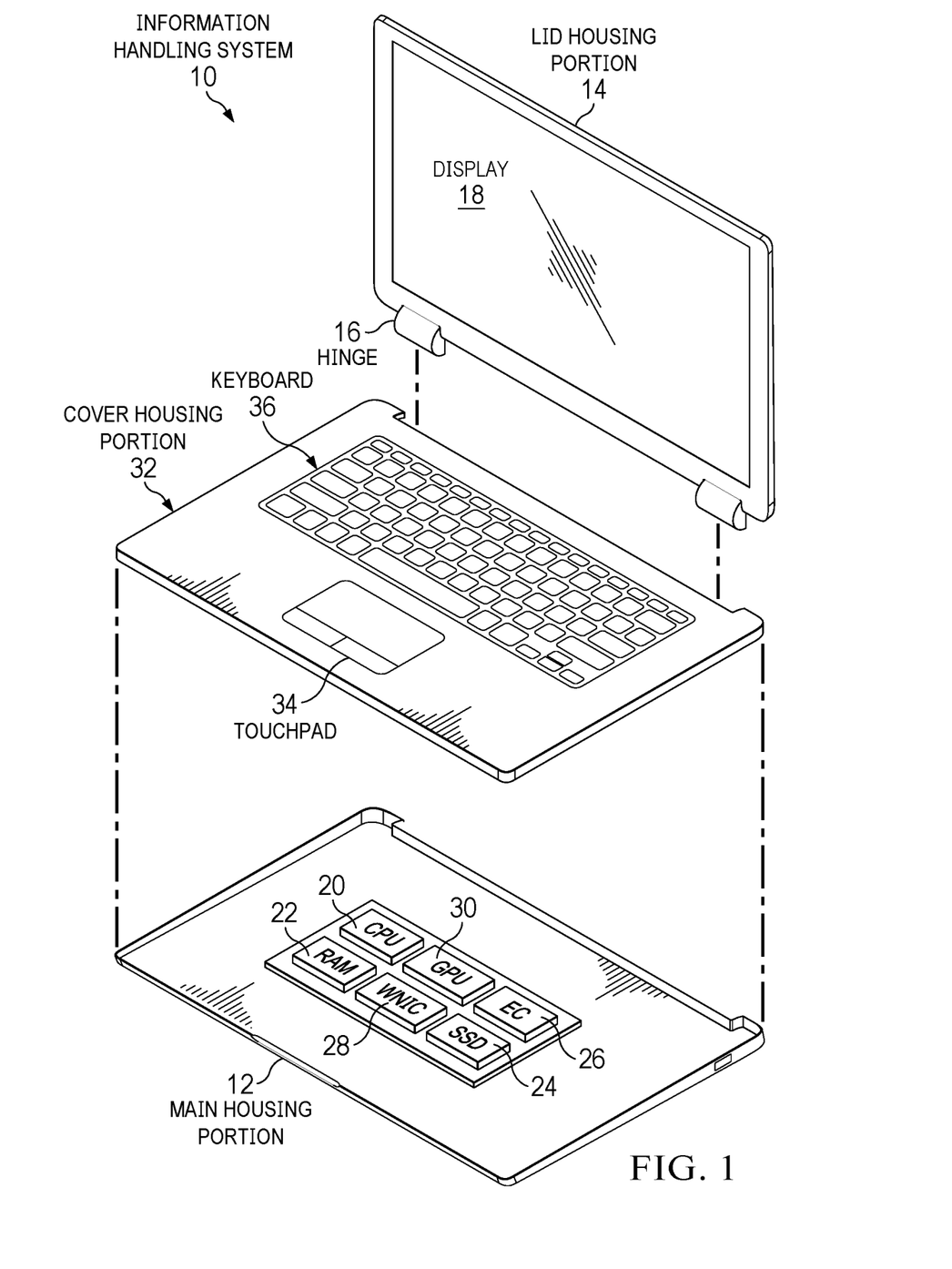
FIG. 1 depicts an exploded perspective view of a portable information handling system having a keyboard with dual thermal conductivity to manage housing temperature.

Referring now to FIG. 1, an exploded perspective view depicts a portable information handling system 10 having a keyboard 36 with dual thermal conductivity to manage housing temperature. In the example embodiment, portable information handling system 10 has a portable housing of a main housing portion 12 rotationally coupled to a lid housing portion 14 by a hinge 16 to rotate between open and closed positions. In the open position, a display 18 is integrated in lid housing portion 14 and presents information as visual images. Main housing portion 12 contains processing components that cooperate to process the information. In the example embodiment, a central processing unit (CPU) 20 executes instructions that process information in cooperation with a random access memory (RAM) 22 that stores the instructions and information. A solid state drive (SSD) 24 provides persistent storage of instructions and information, such as during power down. An embedded controller 26 includes persistent storage and a processing resource that manages system constraints, such as power management, thermal management and interactions with peripheral devices. A wireless network interface controller (WNIC) 28 supports wireless communication with external devices, such as through WIFI and BLUETOOTH. A graphical processing unit (GPU) 30 interfaced with CPU 20 to further process information that defines visual images for presentation at display 18.

Main housing portion 12 has a cover housing portion 32 that couples over the processing components and supports a touchpad 34 and keyboard 36. Touchpad 34 accepts touch inputs that control a cursor position on display 18, similar to a mouse. Keyboard 36 includes plural keys that accept key inputs from an end user. Touchpad and keyboard inputs are communicated through the embedded controller 26 to CPU 20 for use by an operating system and applications that execute on CPU 20. During operation of CPU 20, thermal energy is released by dissipation of power from the CPU, which can result in increased temperatures of the housing near the CPU, including at a location of keyboard 36 above the CPU. A similar effect may take place with other processing components, such as the GPU and RAM. The amount of excess thermal energy can vary significantly based upon the operational state of the information handling system, such as during every computational loads or when the multiple displays are supported by the GPU. In the example embodiment, excess thermal energy is passively rejected from the housing, although alternative embodiments may use active thermal management systems, such as cooling fans. In order to reduce the risk of excessive thermal gradients in the housing and at the keyboard, keyboard 36 includes a support that has different types of material with different thermal conductivities aligned with different processing components to promote a more equal distribution of thermal energy to the housing exterior.

Figure 2:
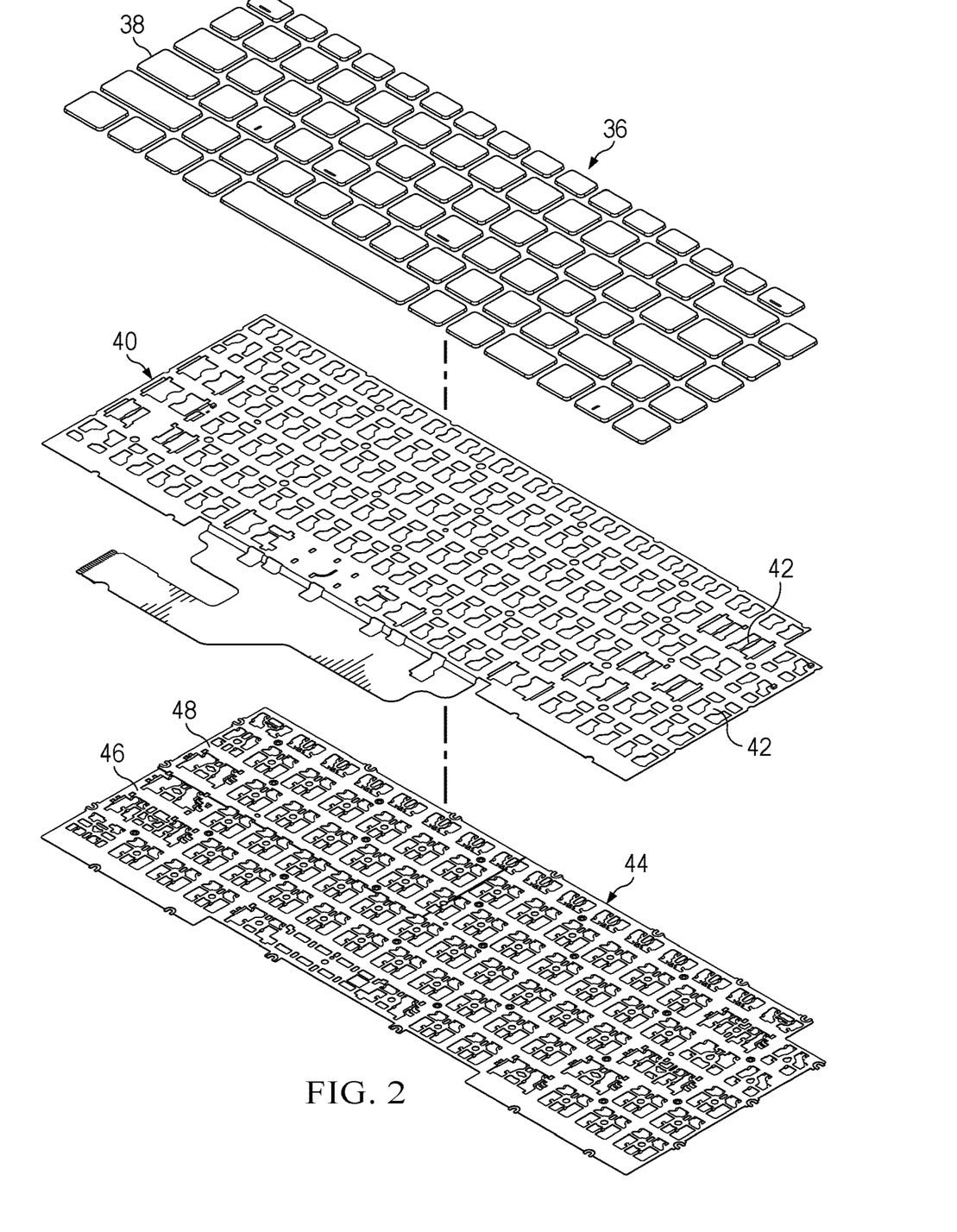
FIG. 2 depicts an exploded perspective view of a keyboard having a support with at least first and second portions of different thermal conductivity.

Referring now to FIG. 2, an exploded perspective view depicts a keyboard 36 having a support with at least first and second portions of different thermal conductivity. In the example embodiment, keyboard 36 has plural keys 38 arranged to accept key inputs, such as with a QWERTY configuration. A membrane 40 disposed under keys 38 has plural sensors 42 to detect which key is pressed, such as with a matrix of circuits that close when pressed down upon by a key aligned with the sensor. A support plate 44 disposed under membrane 40 supports sensors 42 to have inputs detected when a key 38 presses against a sensor 42 to indicate an input. In the example embodiment, support plate 44 has a first portion 46 made of a first material with a first thermal conductivity and a second portion 48 made of a second material with a second thermal conductivity that is less than the first conductivity. In alternative embodiments, additional portions may be defined with the second material or an alternative material to further define how thermal energy transfers through support plate 44. For example, the second portion may align with a CPU and/or GPU so that thermal energy transfer is reduced at the locations of the CPU and CPU through the keyboard. In one example embodiment, the first portion material is a steel plate and the second portion material is one or more of a plastic, a liquid crystal polymer (LCP), a ceramic and an aerogel. In various embodiments, the LCP material can include a delta liquid crystal polymer (DLCP) or a carbon liquid crystal polymer (CLCP). In particular, the high strength and lower thermal conductivity of an LCP material provides a good material choice with a similar material thickness in both the first and second portions offering similar strength.

Figure 3:
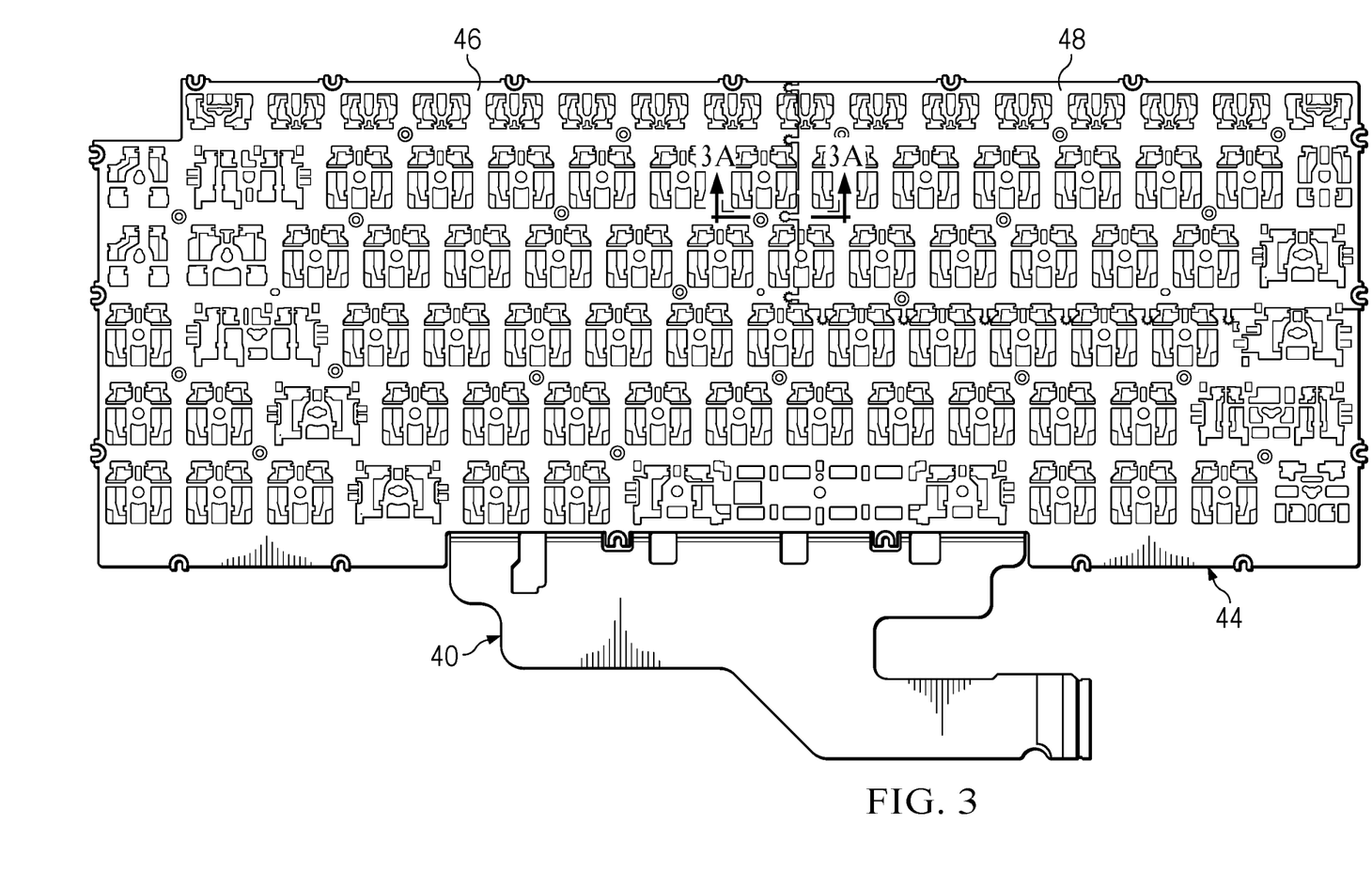
FIGS. 3 and 3A depict a bottom view of the keyboard having the first portion and second portion of the support plate supporting the membrane.
Figure 3A:
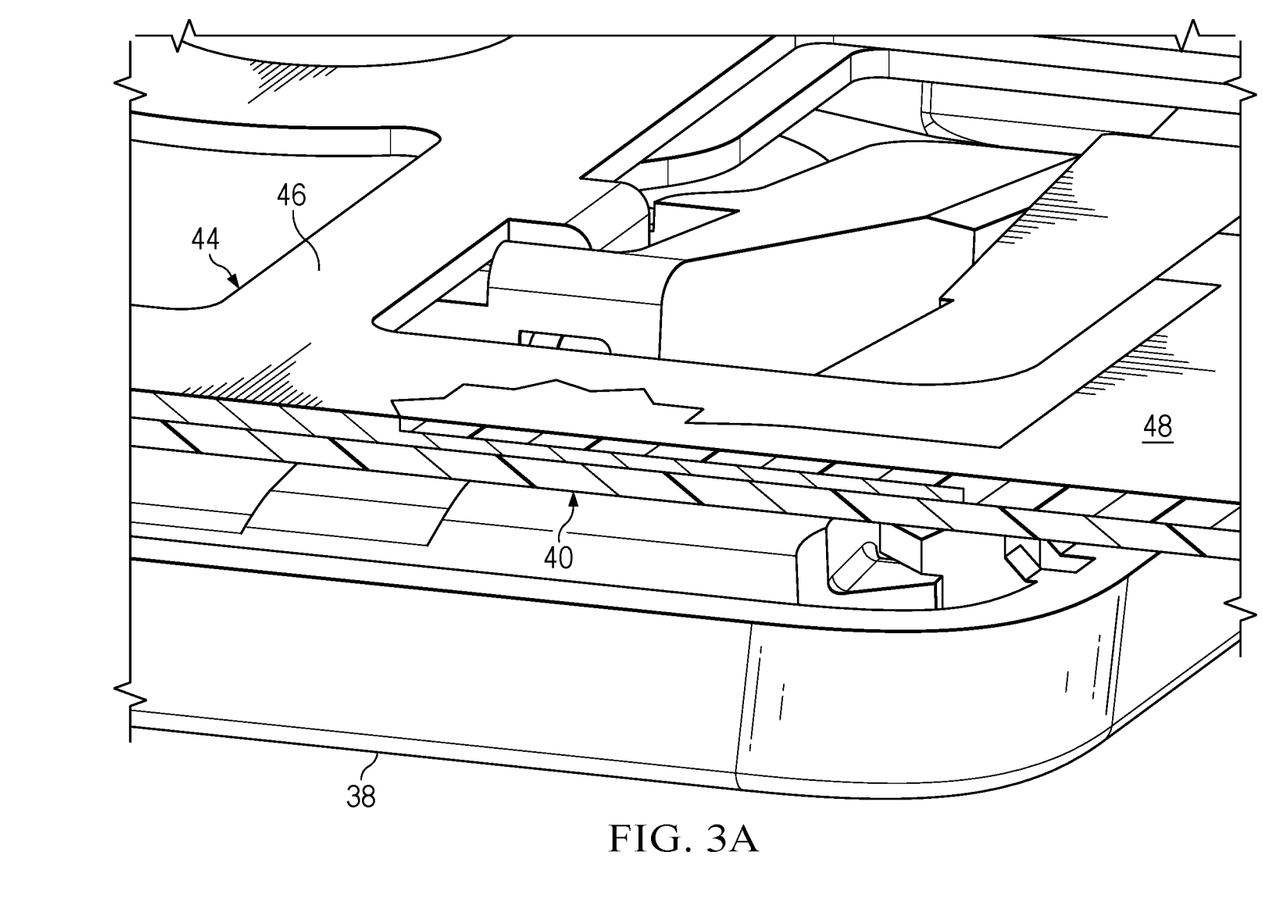

Referring now to FIGS. 3 and 3A, a bottom view of FIG. 3 depicts the keyboard having the first portion 46 and second portion 48 of the support plate 44 supporting the membrane 40. The sectional line of FIG. 3 indicates the sectional view of FIG. 3A. Key 38 clips to support plate 44 and aligns a central post with a sensor in membrane 40. Second portion 48 of support plate 44 extends a member into a cavity formed in first portion 46 of support plate 44 to couple the first and second portions together. In the example embodiment, first portion 46 and second portion 48 have a substantially similar thickness so that the support plate has a thickness. The member of second portion 48 has less than the thickness and fits in a cavity of less than the thickness formed in first portion 46. This arrangement provides a consistent material thickness across both the first and second portions for a uniform key press distance. In an alternative embodiment, the first and second portions may be joined in other ways, such as by having a member extend from the first portion that is insertion injection molded when the second portion is formed, such as with injection molding of plastic. If the material thickness is greater at the insert molding location, that location may be aligned away from a key position or, alternatively, the extra thickness may be formed on a side of the support plate that does not interfere with key movement.

Figure 4:
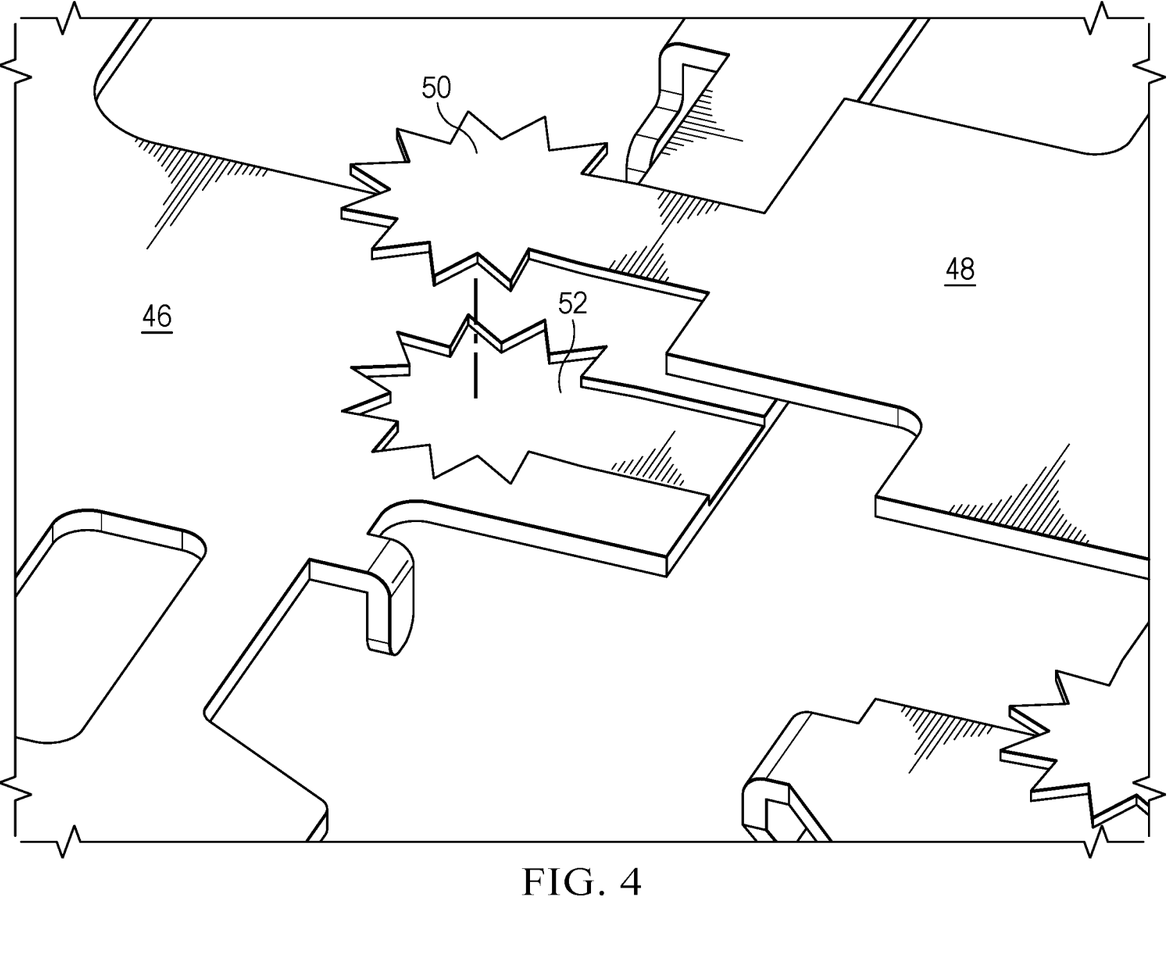
FIG. 4 depicts an exploded side perspective view of a second portion member having a rachet end aligned to couple into first portion cavity formed to accept the member.

Referring now to FIG. 4, an exploded side perspective view depicts a second portion 48 and member 50 having a rachet end aligned to couple into first portion 46 and cavity 52 formed to accept the member. In the example embodiment, the ratchet member has a thickness of substantially one-half the thickness of the support plate and the cavity depth is substantially one-half the thickness of the support plate so that the support plate maintains a uniform thickness where member 50 couples in cavity 52. In alternative embodiments, the thickness of member 50 and depth of cavity 52 may vary based upon the relative strength of the first material and second material. For instance cavity 52 may be an opening through the first portion and member 50 may have the full thickness of the support plate. In the example embodiment, the ratchet shape of member 50 and corresponding shape of cavity 52 provide alignment of the first and second portions and a greater boding area to apply an adhesive to hold the support together as a complete piece. The rachet structure of member 50 has a thickness of 0.15 mm of LCP and cavity 52 is etched in steel to a depth of 0.15 to 0.20 mm. In alternative embodiments, other types of shapes may be used to form the member and the cavity so that the opposing shapes interlock to improve the adhesive bonding force.

Although the present invention has been described in detail, it should be understood that various changes, substitutions and alterations can be made hereto without departing from the spirit and scope of the invention as defined by the appended claims.

What is claimed is:

1. An information handling system comprising: a housing; a processor disposed in the housing and operable to execute instructions that process information; a memory disposed in the housing and interfaced with the processor, the memory operable to store the instructions and information; and
   a keyboard coupled to the housing, the keyboard having plural keys biased out of the housing and configured to depress inward in response to an end user press, the plural keys disposed over a membrane having plural sensors to detect presses of the keys, the membrane supported by a support plate having a thickness of a first material having a first thermal conductivity in a first portion and a second material having a second thermal conductivity in a second portion, the second thermal conductivity less than the first thermal conductivity, the second portion aligned with the processor to avoid a hotspot at the keyboard from thermal energy of the processor;
   wherein: the second portion extends one or more members of less than the thickness towards the first portion; and the first portion has one or more cavities sized to accept the one or more members; and wherein the one or more members has a ratchet structure.

2. The information handling system of claim 1 wherein: the first portion extends one or more members of less than the thickness into the second portion; and
   the second portion encapsulates the one or more members at the second portion.

3. The information handling system of claim 2 wherein the second portion comprises insert injection molded plastic.

4. The information handling system of claim 1, wherein the second material comprises a liquid crystal polymer.

5. The information handling system of claim 1, wherein the second material comprises a ceramic.

6. The information handling system of claim 1, wherein the second material comprises an aerogel.

7. A method for managing information handling system housing temperatures, the method comprising: forming a keyboard support of a thickness to have a first portion of a first material and first thermal conductivity and a second portion of a second material and a second thermal conductivity; coupling a membrane to the keyboard support, the membrane having plural sensors to detect key inputs; coupling plural keys over the membrane to assemble a keyboard that accepts end user presses as inputs and translates the end user presses to the membrane against the keyboard support; and coupling the keyboard to a portable housing with the second portion aligned with a predetermined thermal source within the portable housing; forming the first portion to have a cavity of less than the thickness; and forming the second portion to have a member of less than the thickness that couples into the cavity; wherein the member and cavity have matching ratchet shapes.

8. The method of claim 7 further comprising:
   forming the first portion to have a member extending towards the second portion, the member of less than the thickness; and
   forming the second portion to encapsulate the member.

9. The method of claim 7 wherein: the first material comprises a metal; and the second material comprises a liquid crystal polymer.

10. The method of claim 7 wherein: the first material comprises a metal; and the second material comprises a carbon liquid crystal polymer.

11. The method of claim 7 wherein: the first material comprises a metal; and the second material comprises an aerogel.

12. The method of claim 7 wherein the predetermined thermal source is a central processing unit of the information handling system.

13. A keyboard comprising: plural keys biased upward and configured to depress inward in response to an end user press; a membrane disposed under the plural keys and having plural sensors aligned with the plural keys to detect presses of the plural keys; a support plate disposed under the membrane and having a thickness of a first material having a first thermal conductivity in a first portion and a second material having a second thermal conductivity in a second portion, the second thermal conductivity less than the first thermal conductivity, the second portion aligned with a predetermined thermal source within a portable housing that couples to the keyboard; wherein: the second portion extends one or more members of less than the thickness towards the first portion, member having a carbon liquid crystal polymer material; and the first portion has one or more cavities sized to accept the one or more members; and wherein the member and cavity have matching ratchet shapes.

14. The keyboard of claim 13 wherein:
   the first portion extends one or more members of less than the thickness into the second portion; and
   the second portion encapsulates the one or more members at the second portion.

* * * * *